(12) United States Patent
Hahn et al.

(10) Patent No.: US 9,893,322 B2
(45) Date of Patent: Feb. 13, 2018

(54) ORGANIC LAYER DEPOSITION APPARATUS AND METHOD OF MANUFACTURING ORGANIC LIGHT EMITTING DISPLAY APPARATUS USING THE SAME

(71) Applicant: Samsung Display Co., Ltd., Yongin-si (KR)

(72) Inventors: Jungsuk Hahn, Yongin-si (KR); Taeyong Kim, Yongin-si (KR); Jaeseok Park, Yongin-si (KR); Kyubum Kim, Yongin-si (KR); Jonghee Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/173,008

(22) Filed: Jun. 3, 2016

(65) Prior Publication Data
US 2017/0162832 A1 Jun. 8, 2017

(30) Foreign Application Priority Data

Dec. 4, 2015 (KR) ........................ 10-2015-0172652

(51) Int. Cl.
*H01L 51/56* (2006.01)
*C23C 16/458* (2006.01)
(Continued)

(52) U.S. Cl.
CPC .......... *H01L 51/56* (2013.01); *C23C 16/4586* (2013.01); *H01L 21/67706* (2013.01);
(Continued)

(58) Field of Classification Search
None
See application file for complete search history.

(56) References Cited

U.S. PATENT DOCUMENTS

2013/0009177 A1   1/2013  Chang et al.
2013/0341598 A1*  12/2013 Chang ..................... C23C 14/12
                                                       257/40
(Continued)

FOREIGN PATENT DOCUMENTS

KR   10-2013-0004830   1/2013
KR   10-2014-0007685   1/2014
(Continued)

*Primary Examiner* — Charles Garber
*Assistant Examiner* — Alia Sabur
(74) *Attorney, Agent, or Firm* — H.C. Park & Associates, PLC

(57) ABSTRACT

An organic layer deposition apparatus including: a conveying unit including a first conveying unit conveying in a first direction a moving unit to which a substrate is removably adhered, and a second conveying unit conveying in a direction opposite to the first direction the moving unit from which the substrate is separated, in which the moving unit may be cyclically conveyed by the first and second conveying units; and a deposition unit including a deposition assembly being separate from the substrate while the first conveying unit conveys the substrate adhered to the moving unit and having a material deposited onto the substrate, and a housing having the deposition assembly provided therein and an internal space allowing the moving unit to pass therethrough, in which the movable unit may include a main body unit, an electrostatic chuck provided on the main body unit and having the substrate adhered thereto, a contactless power supply (CPS) module provided facing with the electrostatic chuck each other on the main body unit, and a shield unit having at least a portion thereof provided on the main body unit with the CPS module thereon and preventing heat transfer.

17 Claims, 7 Drawing Sheets

(51) Int. Cl.
*H01L 21/677* (2006.01)
*H01L 21/683* (2006.01)
*H01L 51/00* (2006.01)
H01L 27/32 (2006.01)

(52) U.S. Cl.
CPC ........ *H01L 21/6831* (2013.01); *H01L 51/001* (2013.01); *H01L 27/3244* (2013.01); *H01L 2227/323* (2013.01)

(56) References Cited

U.S. PATENT DOCUMENTS

| | | |
|---|---|---|
| 2014/0014918 A1 | 1/2014 | Han |
| 2014/0084263 A1 | 3/2014 | Jin et al. |
| 2014/0346467 A1 | 11/2014 | Yun et al. |

FOREIGN PATENT DOCUMENTS

| | | |
|---|---|---|
| KR | 10-2014-0038748 | 3/2014 |
| KR | 10-2014-0139359 | 12/2014 |
| KR | 10-2015-0071534 | 6/2015 |

* cited by examiner

ORGANIC LAYER DEPOSITION APPARATUS AND METHOD OF MANUFACTURING ORGANIC LIGHT EMITTING DISPLAY APPARATUS USING THE SAME

CROSS-REFERENCE TO RELATED APPLICATION

This application claims priority from and the benefit of Korean Patent Application No. 10-2015-0172652, filed on Dec. 4, 2015, which is hereby incorporated by reference for all purposes as if fully set forth herein.

BACKGROUND

Field

Exemplary embodiments relate to an apparatus and a method, and more particularly, to an organic layer deposition apparatus and a method of manufacturing an organic light emitting display apparatus using the organic layer deposition apparatus.

Discussion of the Background

An organic light emitting display apparatus has advantages over many other kinds of display apparatuses currently in use, such as wide viewing angles, excellent contrast, and fast response speeds. Thus, the organic light emitting display element has received attention as a next-generation display element among display apparatuses.

The organic light emitting display apparatus has a configuration in which an intermediate layer is disposed between a first electrode and a second electrode facing each other, the intermediate layer including a light emitting layer. In this case, the first and second electrodes and the intermediate layer may be formed via various methods, one of which is an independent deposition method. A fine metal mask (FMM), which has openings with patterns identical or similar to patterns on the intermediate layer, etc., is adhered to a substrate on which the intermediate layer, etc. are to be provided. Then, materials for the intermediate layer, etc., are deposited, and the intermediate layer, etc., with certain patterns are formed.

However, the method of using the FMM has a limitation in that using a large mother glass is inadequate for forming a large-area organic light emitting display apparatus. The reason for this is that a large-area FMM causes a bending phenomenon as a result of its own weight, and the bending action may result in distorted patterns. This effect is contrary to the current trend for a fixed shape of patterns.

In addition, a great amount of time is required in a process of separating the substrate from the FMM after the substrate and the FMM have been aligned with and adhered to each other and the deposition has been performed, which results in a lengthened manufacturing time and reduced production efficiency.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic layer deposition apparatus and a method of manufacturing an organic light emitting display apparatus using the organic layer deposition apparatus, which solves a problem that a substrate may not be adhered to a carrier due to thermal deformation in the carrier caused by an induced current being generated while a conventional organic layer deposition apparatus and a method of manufacturing a conventional organic light emitting display apparatus use wireless charging.

Additional aspects will be set forth in the detailed description which follows, and, in part, will be apparent from the disclosure, or may be learned by practice of the inventive concept.

An exemplary embodiment discloses an organic layer deposition apparatus including: a conveying unit including a first conveying unit configured to convey, in a first direction, a moving unit to which a substrate is removably adhered, and a second conveying unit configured to convey, in a second direction opposite to the first direction, the moving unit from which the substrate has been separated, in which the moving unit is cyclically conveyed by the first and second conveying units; and a deposition unit including a deposition assembly separate from the substrate and configured to deposit a material onto the substrate while the first conveying unit conveys the substrate adhered to the moving unit, and a housing having the deposition assembly provided therein and an internal space allowing the moving unit to pass therethrough, in which the movable unit may include a main body unit, an electrostatic chuck provided on the main body unit and having the substrate adhered thereto, a contactless power supply (CPS) module facing with the electrostatic chuck each other on the main body unit, and a shield unit having at least a portion thereof provided on the main body unit with the CPS module thereon to prevent heat transfer.

An exemplary embodiment also discloses a method of manufacturing an organic light emitting display apparatus, including adhering a substrate onto a bottom surface of a moving unit; conveying the moving unit to a first conveying unit configured to pass through a chamber while the substrate is adhered to the moving unit; forming a layer by depositing the deposition material supplied from the deposition assembly onto the substrate while conveying the substrate to the first conveying unit relatively in the first direction with respect to the deposition assembly, in a state of maintaining the deposition assembly provided inside the chamber and the substrate separate from the deposition assembly; and returning the moving unit having been separate from the substrate to a second conveying unit configured to pass through the chamber, in which the moving unit may block a transfer of heat generated in the second conveying unit while being returned by the second conveying unit.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
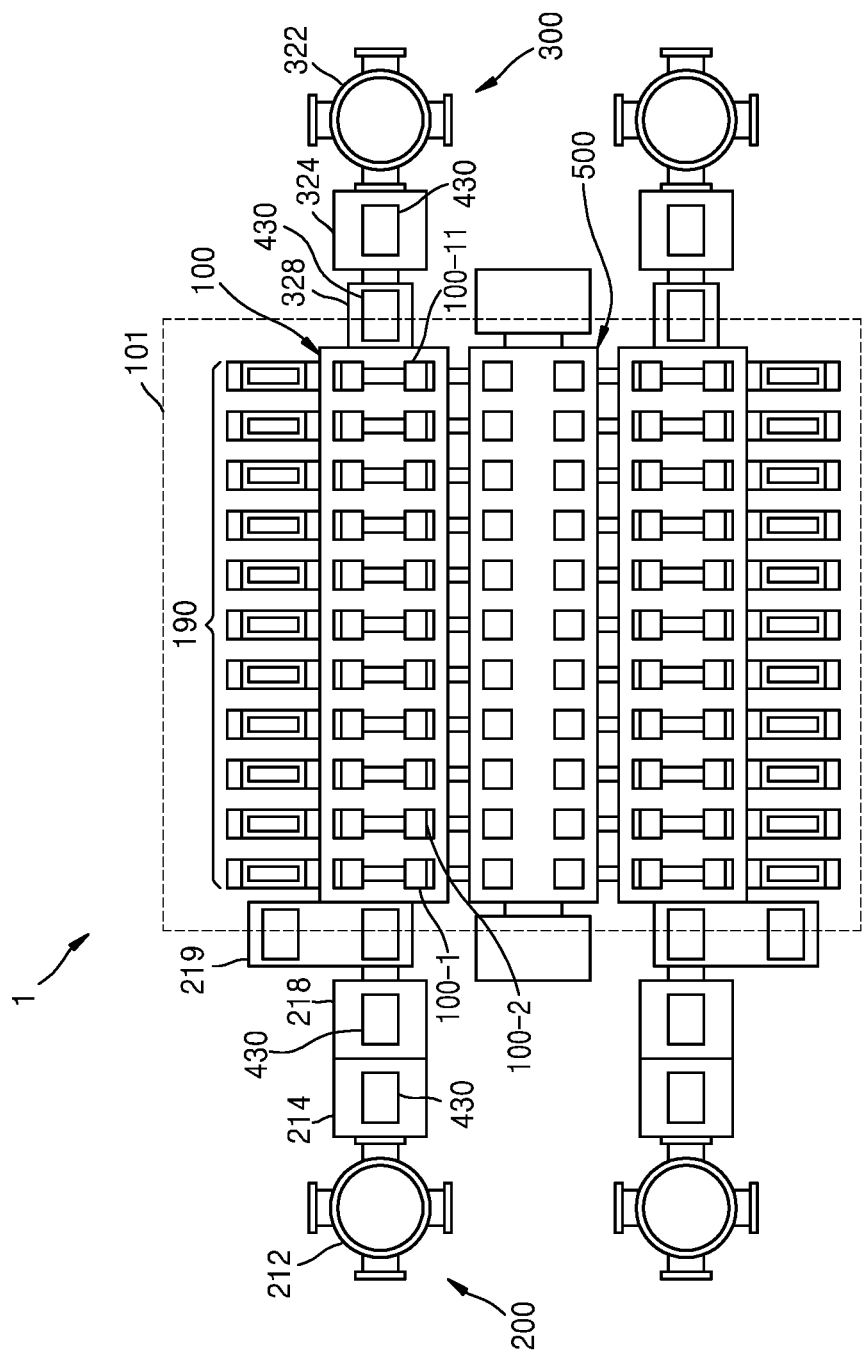
FIG. 1 is a plan view of an organic layer deposition apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
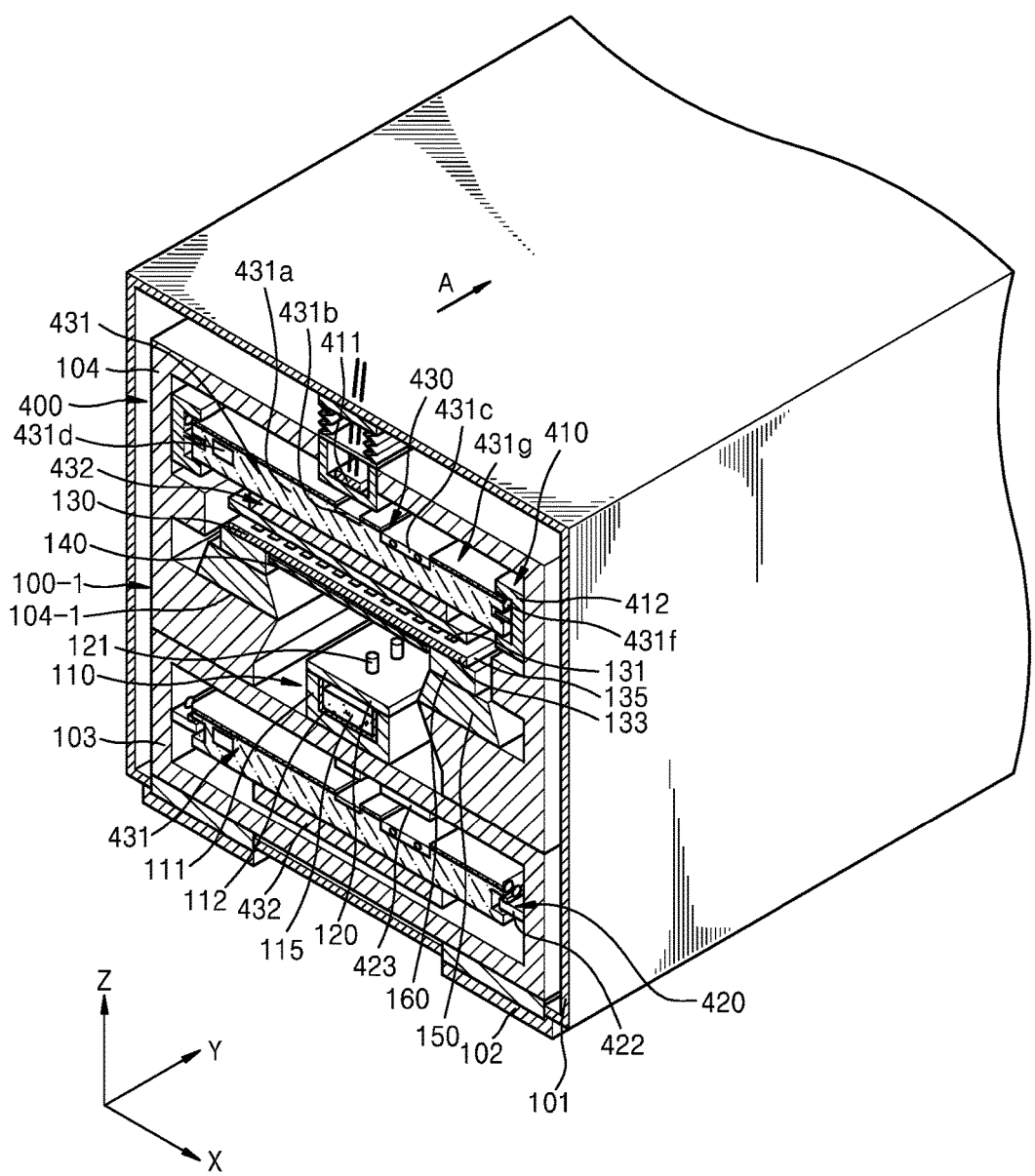
FIG. 2 is a perspective view of a portion of a deposition unit of the organic layer deposition apparatus illustrated in FIG. 1 according to an exemplary embodiment.
Figure 3:
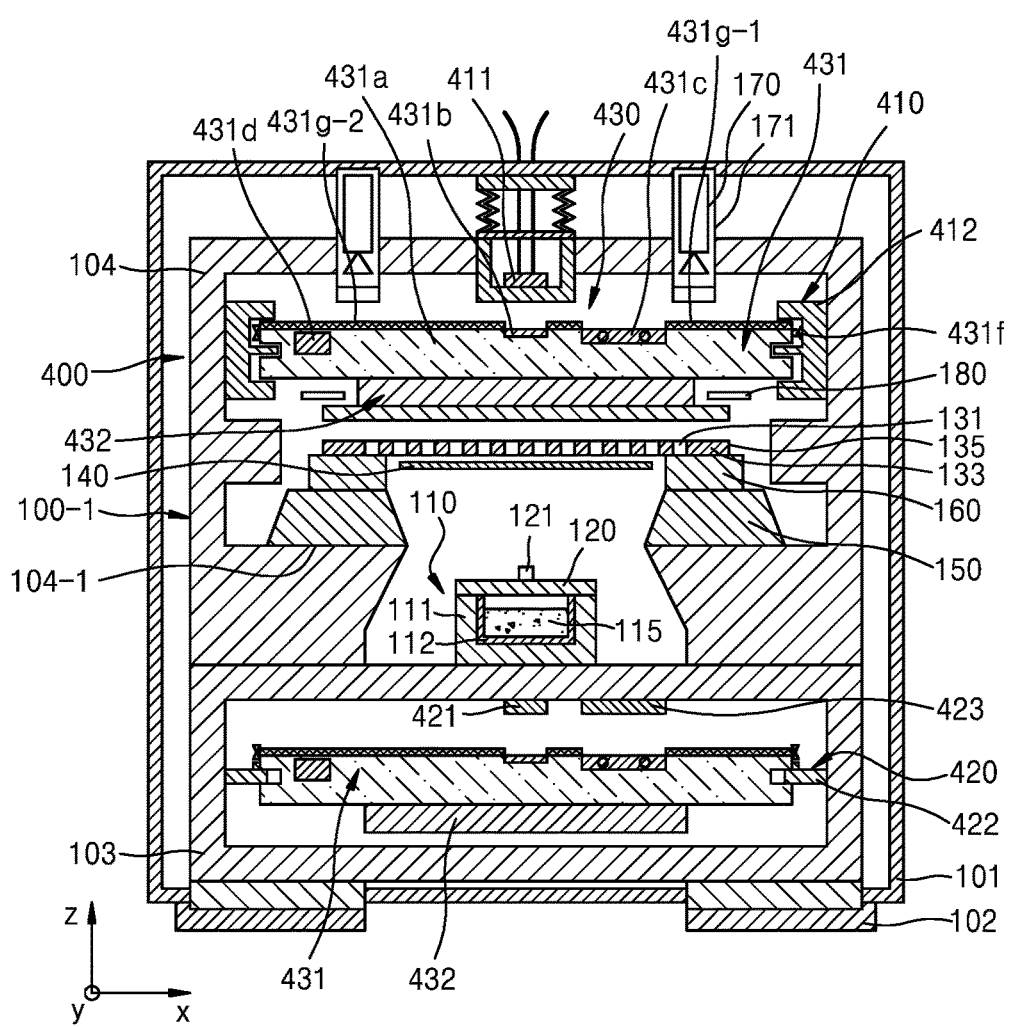
FIG. 3 is a cross-sectional view of a portion of the deposition unit of the organic layer deposition apparatus illustrated in FIG. 1.
Figure 4:
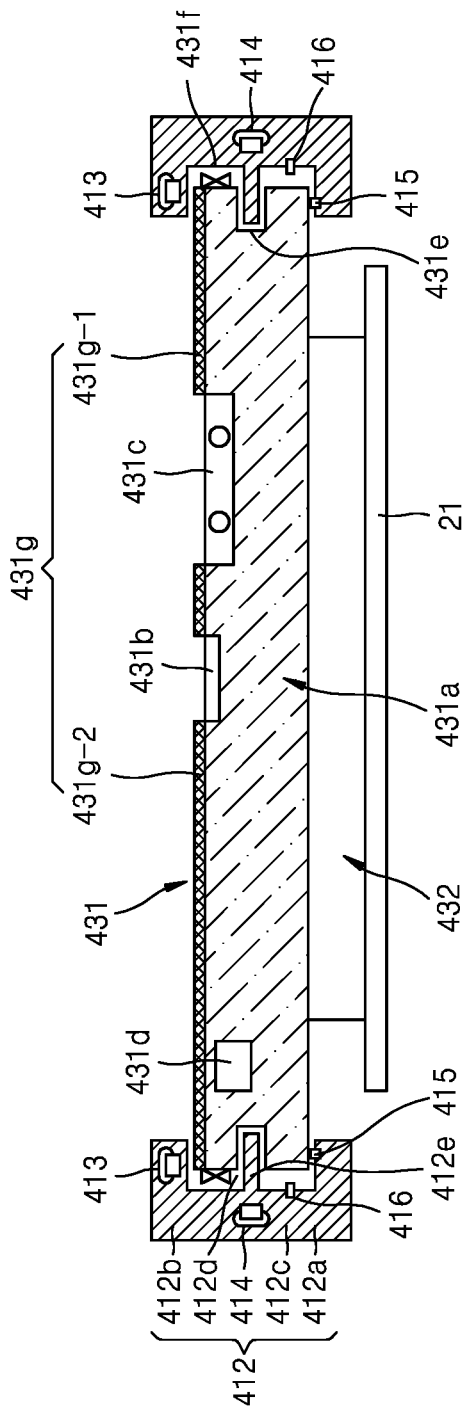
FIG. 4 is a cross-sectional view of a first conveying unit and a moving unit of the deposition unit of the organic layer deposition apparatus of FIG. 1 according to an exemplary embodiment.

FIG. 1 is a plan view of an organic layer deposition apparatus according to one or more exemplary embodiments. FIG. 2 is a perspective view of a portion of a deposition unit of the organic layer deposition apparatus illustrated in FIG. 1. FIG. 3 is a cross-sectional view of a portion of the deposition unit of the organic layer deposition apparatus illustrated in FIG. 1. FIG. 4 is a cross-sectional view of a first conveying unit and a moving unit of the deposition unit of the organic layer deposition apparatus of FIG. 1 according to an exemplary embodiment.

Referring to FIGS. 1 through 4, an organic layer deposition apparatus 1 may include a deposition unit 100, a loading unit 200, an unloading unit 300, and a conveying unit 400.

The loading unit 200 may include a first rack 212, a loading chamber 214, a first reversal chamber 218, and a buffer chamber 219.

A plurality of substrates 21 prior to the deposition may be loaded on the first rack 212. A loading robot equipped in the loading chamber 214 may grab a substrate 21 from the first rack 212, place the substrate 21 on a moving unit 430 conveyed from a second conveying unit 420, and carry the moving unit 430 with the substrate 21 attached thereto to the first reversal chamber 218.

The first reversal chamber 218 may be adjacent to the loading chamber 214, and may include a first reversal robot that may reverse the moving unit 430 on the first reversal chamber 218 and load the moving unit 430 onto a first conveying unit 410.

As illustrated in FIG. 1, the loading robot of the loading chamber 214 may place the substrate 21 onto a top surface of the moving unit 430, and the moving unit 430 may be conveyed to the first reversal chamber 218 in this state. As the first reversal robot of the reversal chamber 218 reverses the reversal chamber 218, the substrate 21 may face downward in the deposition unit 100.

A configuration of the unloading unit 300 may be opposite to that of the loading unit 200 described above. In other words, a second reversal robot may reverse, in a second reversal chamber 328, the substrate 21 and the moving unit 430 having passed the deposition unit 100, and move them to a removal chamber 324. A removal robot may take out the substrate 21 and the moving unit 430 from the removal chamber 324, separate the substrate 21 from the moving unit 430, and load the substrate 21 onto a second rack 322. The moving unit 430, separated from the substrate 21, may be conveyed back to the loading unit 200 via the second conveying unit 420.

However, the present inventive concept is not limited thereto, and the substrate 21 may be directly conveyed to the deposition unit 100 while the substrate 21 is adhered to the bottom surface of the moving unit 430, since the substrate 21 has first been adhered to the moving unit 430. In this case, the first reversal robot in the first reversal chamber 218 and the second reversal robot in the second reversal chamber 328 may be unnecessary and, therefore, omitted.

The deposition unit 100 may include at least one chamber 101 for deposition. According to an exemplary embodiment illustrated in FIG. 1, the deposition unit 100 may include the chamber 101, and a plurality of organic layer deposition assemblies 100-1, 100-2, . . . , 100-n may be provided in the chamber 101. According to an exemplary embodiment illustrated in FIG. 1, eleven organic layer deposition assemblies, that is, a first organic layer deposition assembly 100-1, a second organic layer deposition assembly 100-2, . . . , an 11$^{th}$ organic layer deposition assembly 100-11 are provided in the chamber 101, although the number of organic layer deposition assemblies may be changed depending on the deposition material and deposition conditions. The chamber 101 may be maintained at a vacuum while the deposition is performed.

One or more of the eleven organic layer deposition assemblies may be used for depositing common layers, and the others may be used for depositing pattern layers. In this case, the organic layer deposition assemblies used for depositing common layers may not include separate patterning slit sheets 130 (see FIG. 2).

According to an exemplary embodiment illustrated in FIG. 1, the moving unit 430 having the substrate 21 adhered thereto may be sequentially conveyed by the first conveying unit 410 to the deposition unit 100, or to the loading unit 200, to the deposition unit 100, and to the unloading unit 300. The moving unit 430 having been separated from the substrate 21 in the unloading unit 300 may be returned to the loading unit 200 via the second conveying unit 420.

The first conveying unit 410 may be configured to pass through the chamber 101 when passing through the deposition unit 100, and the second conveying unit 420 may be configured to convey the moving unit 430 with the substrate 21 separated therefrom.

The organic layer deposition apparatus 1 may have the first and second conveying units 410 and 420 respectively provided above and below in the organic layer deposition apparatus 1. Thus, after the moving unit 430, having the deposition completely performed thereon while passing through the first conveying unit 410, has the substrate 21 separated therefrom in the unloading unit 300, the moving unit 430 may be returned to the loading unit 200 via the second conveying unit 420 provided under the first conveying unit 410, and accordingly, space utilization may be enhanced.

The deposition unit 100 in FIG. 1 may further include a deposition source replacement unit 190 on one side of the organic layer deposition assembly 100-1. Although not illustrated in detail in the drawing, the deposition source replacement unit 190 may be a cassette type, and may be drawn from the organic layer deposition assembly 100-1 to the outside. Thus, ease of replacement of the deposition source 110 (see FIG. 3) of the organic layer deposition assembly 100-1 may be enhanced.

FIG. 1 illustrates two sets provided in parallel with each other, in which each set is to compose the organic layer deposition apparatus including the loading unit 200, the deposition unit 100, the unloading unit 300, and the conveying unit 400. In other words, it will be understood that a total of two organic layer deposition apparatuses 1 are respectively provided on an upper side and on a lower side of FIG. 1. In this case, a patterning slit sheet replacement unit 500 may be further included between the two organic layer deposition apparatuses 1. In other words, since the patterning slit sheet replacement unit 500 is provided between the two organic layer deposition apparatuses 1, and thus, the two organic layer deposition apparatuses 1 may commonly use the patterning slit sheet replacement unit 500, space utilization may be enhanced, compared with a case in which each of the organic layer deposition apparatuses 1 includes the patterning slit sheet replacement unit 500.

The deposition unit 100 of the organic layer deposition apparatus 1 may include at least one of the organic layer deposition apparatus 100-1 and the conveying unit 400.

An overall configuration of the deposition unit 100 will be described below.

The chamber 101 may have a hollow box shape and include at least one of the organic layer deposition assembly 100-1 and the conveying unit 400 therein. In another aspect, a foot 102 may be configured to be fixed on the ground, a bottom housing 103 may be provided on the foot 102, and a top housing 104 may be provided above the bottom housing 103. The chamber 101 may be configured to accommodate both of the bottom housing 103 and the top housing 104 therein. A connecting area connecting the bottom housing 103 and the chamber 101 may be encapsulated, and the inside of the chamber 101 may be completely blocked from the outside. Thus, the bottom housing 103 and the top housing 104 may maintain a fixed location even with repeated shrinkage or expansion of the chamber 101 by disposing the bottom housing 103 and the top housing 104 on the foot 102, which is fixed on the ground. Accordingly, the bottom housing 103 and the top housing 104 may function as a certain reference frame in the deposition unit 100.

The organic layer deposition assembly 100-1 and the first conveying unit 410 of the conveying unit 400 may be provided in the top housing 104, and the second conveying unit 420 of the conveying unit 400 may be provided in the bottom housing 103. In addition, because the moving unit 430 may make a cyclic movement between the first and second conveying units 410 and 420, the deposition may be continuously performed.

A detailed configuration of the organic layer deposition assembly 100-1 will be described below.

The organic layer deposition assembly 100-1 may include a deposition source 110, a deposition source nozzle unit 120, a patterning slit sheet 130, a blocking member 140, a first stage 150, a second stage 160, a camera 170, a sensor 180, etc. All configuration components in FIGS. 2 and 3 may be provided in the chamber 101, in which a proper degree of vacuum is maintained, in order to secure a straightness of the deposition material.

A high degree of vacuum, identical to that of an FMM deposition method, in (not illustrated) the chamber 101 may need to be maintained so that a deposition material 115 supplied from the deposition source 110 may pass through the deposition source nozzle unit 120 and the patterning slit sheet 130 and may be deposited into a desired pattern. In addition, the temperature of the patterning slit sheet 130 may need to be sufficiently lower than that of the deposition source 110 (for example, equal to or less than about 100° C.). The reason for this is that only when the temperature of the patterning slit sheet 130 is sufficiently low, a problem of thermal expansion of the patterning slit sheet 130 may be minimized.

The substrate 21, a deposition object, may be provided in the chamber 101. The substrate 21 may be a flat display apparatus substrate, and a large area substrate, such as a mother glass for forming a plurality of flat display apparatuses, may be used.

A size of the FMM needs to be the same as that of a substrate in a conventional FMM deposition method. Accordingly, as the size of the substrate increases, the FMM needs to be larger and thus, a problem may arise that manufacturing the FMM becomes more difficult and aligning the FMM with a fine pattern via stretching of the FMM also becomes more difficult.

To solve such problems, the organic layer deposition assembly 100-1 according to an exemplary embodiment may perform deposition while the organic layer deposition assembly 100-1 and the substrate 21 move relative to each other. In other words, the deposition may be continuously performed as the substrate 21 facing the organic layer deposition assembly 100-1 moves in a y-axis direction. In other words, as the substrate 21 may move in a direction of an arrow A in FIG. 2, the deposition may be performed utilizing a scanning method. A case in which the deposition is performed as the substrate 21 moves in the y-axis direction in the chamber (not illustrated) is illustrated in the drawing. However, the present inventive concept is not limited thereto, and the organic layer deposition assembly 100-1 may itself move in the y-axis direction and the deposition may be performed while the substrate 21 is fixed.

Thus, the patterning slit sheet 130 may be manufactured to be much smaller than that of a conventional FMM with the organic layer deposition assembly 100-1 of the present inventive concept. In other words, since the deposition is continuously performed in a scanning method as the substrate 21 moves along the y-axis direction in the organic layer deposition assembly 100-1 of the present inventive concept, a length of the patterning slit sheet 130 in at least one of the x-axis and the y-axis directions may be much less than that of the substrate 21. In this manner, the patterning slit sheet 130 may be manufactured to be much smaller than that of a conventional FMM and thus, the patterning slit sheet 130 of the present inventive concept may be easily manufactured. In other words, the patterning slit sheet 130 having a smaller size than that of conventional FMM may be advantageous over the FMM deposition method with regard to various processes, such as an etching operation of the patterning slit sheet 130, subsequent fine stretching and welding operations, and transfer and cleaning operations. Additionally, this advantage may increase as a display apparatus becomes large.

The organic layer deposition assembly 100-1 and the substrate 21 may need to be separate from each other so that the deposition may be performed as the organic layer deposition assembly 100-1 and the substrate 21 move relative to each other.

The deposition source 110 accommodating and heating the deposition material 115 may be provided on a side facing the substrate 21 in the chamber 101. The deposition may be performed onto the substrate 21 as the deposition material 115 accommodated in the deposition source 110 evaporates.

The deposition source 110 may include a furnace 111 having the deposition material 115 filled therein, and a heater 112 which may heat the furnace 111 and evaporate the deposition material 115 having filled the furnace 111 toward a side of the furnace 111, in detail, toward the deposition source nozzle unit 120.

The deposition source nozzle unit 120 may be provided on a side of the deposition source 110, in detail, toward the substrate 21 from the deposition source 110.

The patterning slit sheet 130 may be further included between the deposition source 110 and the substrate 21. The patterning slit sheet 130 may further include a frame 135 in a shape of a window frame, and a plurality of patterning slits 131 along the x-axis direction. The deposition material 115 evaporated from the deposition source 110 may pass through the deposition source nozzle unit 120 and the patterning slit sheet 130, and reach the substrate 21, the body to be deposited. In this case, the total number of deposition source nozzles 121 may be greater than that of the patterning slits 131.

The deposition source 110 described above (and the deposition source nozzle unit 120 combined therewith) and the patterning slit sheet 130 may be separate from each other.

As described above, according to an exemplary embodiment, the organic layer deposition assembly 100-1 may perform deposition while moving relative to the substrate 21, and the patterning slit sheet 130 may be separate from the substrate 21 so that the organic layer deposition assembly 100-1 may move relative to the substrate 21.

The deposition process has been performed with a substrate adhered to a mask for preventing shadows on the substrate in a conventional FMM deposition method. However, when the substrate is adhered to the mask as such, low quality may result because of contact between the substrate and the mask. In addition, because the mask may not move with respect to the substrate, the mask may need to be formed with an identical size like the substrate. Accordingly, although the mask size needs to increase as the display apparatus becomes larger, there is a problem that preparation of a large mask becomes more difficult.

To solve such a problem, the patterning slit sheet 130 of the organic layer deposition assembly 100-1 may be separate from the substrate 21, the body to be deposited, by a certain gap, according to an exemplary embodiment.

Because it has become possible to form a mask smaller than a substrate and perform deposition while moving the mask with respect to the substrate, preparing the mask may be easy. In addition, reduced quality due to contact between the substrate and the mask may be prevented. Additionally, since a time for adhering the substrate and the mask to each other during a process is unnecessary, a manufacturing speed may be enhanced.

Next, a detailed arrangement of configuration components in the top housing 104 is described below.

First, the deposition source 110 and the deposition source nozzle unit 120 described above may be disposed on a bottom portion of the top housing 104. Then, a seating unit 104-1 may protrude on both sides of the deposition source 110 and the deposition source nozzle unit 120, and the first stage 150, the second stage 160, and the patterning slit sheet 130 described above may be sequentially provided on the seating unit 104-1.

The first stage 150 may be configured to move in the x-axis and y-axis directions, and align the patterning slit sheet 130 in the x-axis and y-axis directions the patterning slit sheet 130. In other words, the first stage 150 may include a plurality of actuators and be configured to move with respect to the top housing 104 in the x-axis and y-axis directions.

The second stage 160 may be configured to move in a z-axis direction and align the patterning slit sheet 130 in the z-axis direction with the patterning slit sheet 130. In other words, the second stage 160 may include a plurality of actuators and be configured to move with respect to the first stage 150 in the z-axis direction.

The patterning slit sheet 130 may be on the second stage 160. Since the patterning slit sheet 130 is on the first and second stages 150 and 160, and is configured to move in the x-axis, y-axis, and z-axis directions, an alignment, especially a real-time alignment between the substrate 21 and the patterning slit sheet 130 may be performed.

Furthermore, the top housing 104, the first stage 150, and the second stage 160 may simultaneously guide a moving path of the deposition material 115 so that the deposition material supplied from the deposition source nozzle 121 does not disperse. In other words, since the moving path of the deposition material is sealed by the top housing 104, and the first and second stages 150 and 160, movements of the deposition material in the x-axis and y-axis directions may be simultaneously guided.

The blocking member 140 may be further included between the patterning slit sheet 130 and the deposition source 110. An anode electrode or a cathode electrode may be provided on the outskirt portion of the substrate 21, and there is an area which may be utilized as a terminal for product inspection or product manufacturing in the future. When an organic material is deposited in this area, the anode electrode or the cathode electrode may not perform its role, and thus, the outskirt portion of the substrate 21 may need to be a non-deposition area onto which an organic material, etc., are not deposited. However, because the deposition is performed in a scanning method while the substrate 21 moves with respect to an organic layer deposition assembly 100-1 in the organic layer deposition apparatus 1 of the present disclosure, it may not be easy to prevent the deposition of the organic material onto the non-deposition area of the substrate 21.

To prevent the deposition of the organic material onto the non-deposition area of the substrate 21, a separate blocking member 140 may be further included on the outer portion of the substrate 21 in the organic layer deposition apparatus 1 according to an exemplary embodiment. Although not illustrated in detail in the drawing, the blocking member 140 may include two plates adjacent to each other.

When the substrate 21 does not pass through the organic layer deposition assembly 100-1, the deposition material 115 supplied from the deposition source 110 may be prevented from reaching the patterning slit sheet 130 by by the blocking member 140. When the substrate 21 enters the organic layer deposition assembly 100-1 in such a state, the blocking member 140 at the front, which has been blocking the deposition source 110, may move with a movement of the substrate 21, the moving path of the deposition material may become opened, and the deposition material 115 supplied from the deposition source 110 may pass through the patterning slit sheet 130 and be deposited onto the substrate 21. When an entire portion of the substrate 21 has passed through the organic layer deposition assembly 100-1, the blocking member 140 at the rear may move with the movement of the substrate 21, again close the movement path of the deposition material, and block the deposition source 110 so that the deposition material 115 supplied from the deposition source 110 may not reach the patterning slit sheet 130.

Thus, the deposition of the organic material onto the non-deposition area of the substrate 21 may be prevented, without any additional structure, by using the blocking member 140 to block the non-deposition area of the substrate 21.

The conveying unit 400 conveying the substrate 21, the body to be deposited, will be described in detail below.

The conveying unit 400 may include the first conveying unit 410, the second conveying unit 420, and the moving unit 430.

The first conveying unit 410 may convey in-line the moving unit 430 and the substrate 21 adhered to the moving unit 430 so that an organic layer may be deposited onto the substrate 21 by the organic layer deposition assembly 100-1. The first conveying unit 410 may include a coil 411, a guide unit 412, a top surface magnetic levitation bearing 413, a side surface magnetic levitation bearing 414, and gap sensors 415 and 416.

The second conveying unit 420 may convey the moving unit 430, separated from the substrate 21 in the unloading unit 300, back to the loading unit 200, after the substrate 21 and the moving unit 430 have passed through the deposition unit 100 and a cycle of deposition has been completed. The second conveying unit 420 may include a coil 421, a roller guide 422, and a charging track 423.

The moving unit 430 may include a carrier 431 being conveyed along the first and second conveying units 410 and 420, and an electrostatic chuck 432 provided on one surface of the carrier 431 and having the substrate 21 adhered thereto.

A detailed description will be given in detail on each of configuration components of the conveying unit 400, in which the carrier 431 of the conveying unit is described in detail.

The carrier 431 may include a main body unit 431*a*, a linear motor system (LMS) magnet 431*b*, a contactless power supply (CPS) module 431*c*, a power supply 431*d*, and a guide slot 431*e*. The carrier 431 may further include a cam follower 431*f* In addition, the carrier 431 may further include a cover 431*g* provided on the main body unit 431*a*. The cover 431*g* may be integrally provided with the main body unit 431*a* or may be combined with the main body unit 431*a* after separate forming. A case in which the cover 431*g* is provided so as to be separable from the main body unit 431*a* is described in detail below for the sake of convenience.

The main body unit 431*a* may be a foundation unit of the carrier 431 and include a magnetic material, such as iron. The carrier 431 may maintain a state of being separated from the guide unit 412 by a certain degree via a repulsive force between the main body unit 431*a* of the carrier 431 and magnetic levitation bearings 413 and 414 to be described below.

The guide slot 431*e* may be provided in both of side surfaces of the main body unit 431*a*. In addition, the guide protuberance 412*e* of the guide unit 412 may be accommodated inside the guide slot 431*e*.

A magnetic rail 431*b* may be provided along a centerline of a moving direction of the main body unit 431*a*. A linear motor may be formed via combining the magnetic rail 431*b* of the main body unit 431*a* and a coil 411 to be described below, and the carrier 431 may be conveyed in the A direction via the linear motor.

The CPS module 431*c* and the power supplier 431*d* may be provided on opposite sides of the magnetic rail 431*b* on the main body unit 431*a*. The power supplier 431*d* may be a kind of a chargeable battery providing a power to the electrostatic chuck 432 chucking the substrate 21 and maintaining the chucking state, and the CPS module 431*c* is a wireless chargeable module to charge the power supplier 431*d*. The charging track 423 on the second conveying unit 420, to be described below, may be connected to an inverter (not illustrated), and when the carrier 431 is conveyed on the second conveying unit 420, the charging track 423 may supply the power to the CPS module 431*c* via an electromagnetic field generated between the charging track 423 and the CPS module 431*c*. Then, the power supplied to the CPS module 431*c* may charge the power supplier 431*d*.

At least one cover 431*g* may be included. The cover 431*g* may be disposed on one surface of the main body unit 431*a*. When the moving unit 430 is disposed on the second conveying unit 420, the cover 431*g* may be provided on one surface of the main body unit 431*a* facing with the charging track 423 each other of the second conveying unit 420.

The cover 431*g* may include a shield unit 431*g*-1 and a carrier cover 431*g*-2. The cover 431*g* may be provided on the main body unit 321*a* having the CPS module 431*c* provided thereon. The cover 431*g* may include a surface thereof anodized. Especially, the cover 431*g* may include aluminum. In addition, the surface of the shield unit 431*g*-1 may include an anodized oxide layer, and the oxide layer may include aluminum oxide.

The surface of the shield unit 431*g*-1 may be anodized in a white color. For example, the shield unit 431*g*-1, including an aluminum material, may be inserted into an electrolyte in which at least one of sodium silicate, trisodium citrate, and potassium fluoride is dissolved. In this case, the electrolyte may include sulfuric acid. Then, the surface of the shield unit 431*g*-1 may be anodized in a white color. Thus, the shield unit 431*g*-1 may effectively reflect external radiant heat.

The electrostatic chuck 432 may include a buried electrode applying the power to the inside of its main body including ceramic, and may adhere the substrate 21 onto a surface of its main body via a high voltage applied to the buried electrode.

The first conveying unit 410 and the moving unit 430 will now be described in detail.

The first conveying unit 410 may convey the electrostatic chuck 432 fixing the substrate 1 and the carrier 431 conveying them. The first conveying unit 410 may include the coil 411, the guide unit 412, the top surface levitation bearing 413, the side surface levitation bearing 414, and gap sensors 415 and 416.

The coil 411 and the guide unit 412 may be provided on respective internal surfaces of the top housing 104, the coil 411 may be provided on the internal surface of a top side of the top housing 104, and the guide unit 412 may be provided on the internal surfaces of both sides of the top housing 104.

The guide unit 412 may guide the carrier 431 to move in one direction. In this case, the guide unit 412 may be configured to pass through the deposition unit 100.

The guide unit 412 may accommodate both sides of the carrier 431 and guide the carrier 431 to move along the A direction in FIG. 2. The guide unit 412 may include a first accommodation unit 412*a* under the carrier 431, a second accommodation unit 412*b* above the carrier 431, and a connection unit 412*c* connecting the first and second accommodating units 412*a* and 412*b*. An accommodation slot 412*d* may be formed via the first and second accommodation units 412*a* 412*b*, and the connection unit 412*c*. Both sides of the carrier 431 may be respectively accommodated by the accommodation slots 412*d*, and the carrier 431 may move along the accommodation slot 412*d*.

The side surface magnetic levitation bearings 414 may be provided in the connection unit 412*c* of the guide unit 412 so as to respectively correspond to both side surfaces of the carrier 431. The side surface magnetic levitation bearing 414 may generate a gap between the carrier 431 and the guide unit 412, and assist the carrier 431 to move without a contact with the guide unit 412, that is, in a non-contact method while moving along with the guide unit 412. In other words, a gap between the carrier 431 and the guide unit 412 may be generated and uniformly maintained at the same time, while the repulsive force generated between the side surface magnetic levitation bearing 414 on a left side and a carrier 431, a magnetic body, and the repulsive force between the side surface magnetic levitation bearing 414 on the right side and the carrier 431, the magnetic body, are balanced with each other.

The top surface magnetic levitation bearing 413 may be provided in the second accommodation unit 412*b* so as to be located on the top portion of the carrier 431. The top surface magnetic levitation bearing 413 may assist the carrier 431 to move without making contact with the first and second accommodation units 412*a* and 412*b*, while the carrier maintains a certain gap with them, and moves along the guide unit 412. In other words, the gap between the carrier 431 and the guide unit 412 may be generated and uniformly maintained at the same time, while the repulsive force generated between the top surface magnetic levitation bearing 413 and a carrier 431, a magnetic body, and the gravitational force are balanced with each other.

The guide unit 412 may further include the gap sensor 415. The gap sensor 415 may measure the gap between the carrier 431 and the guide unit 412. The gap sensor 415 may be provided in the first accommodation unit 412*a* so as to correspond to the bottom portion of the carrier 431. The gap sensor 415 in the first accommodation unit 412*a* may measure the gap between the first accommodation unit 412*a* and the carrier 431. In addition, the gap sensor 416 may be provided on one side of the side surface magnetic levitation bearing 414. The gap sensor 416 provided near the side surface magnetic levitation bearing 414 may measure the gap between the side surface of the carrier 431 and the side surface magnetic levitation bearing 414. However, the present disclosure is not limited thereto, and the gap sensor 416 may be provided in the connection unit 412*c* also.

The gap between the carrier 431 and the guide unit 412 may be controlled in real-time via a change in electromagnetic forces of the magnetic levitation bearings 413 and 414 corresponding to values measured by gap sensors 415 and 416. In other words, a fine movement of the carrier 431 may be possible via a feedback control by using magnetic levitation bearings 413 and 141, and gap sensors 415 and 416.

A movement of the moving unit 430 will now be described in detail.

The magnetic rail 431*b* of the main body unit 431*a* and the coil 411 may be combined to form a driving unit. The driving unit may be a linear motor. The linear motor generates a low coefficient of friction and finite location errors compared with a conventional slide guidance system, and thus, is an apparatus with a very high degree of positioning accuracy. As described above, the linear motor may include the coil 411 and the magnetic rail 431*b*, and the magnetic rail 431*b* may be provided in a row on the carrier 431, while a plurality of coils 411 may be provided with certain gaps on one side in the chamber 101 so as to face with the magnetic rail 431*b*. Since the magnetic rail 431*b*, not the coil 411, is provided on the carrier 431, the movement of the carrier 431 may be possible without applying a power to the carrier 431.

The coil 411 may be provided in an atmosphere (ATM) box. Although the linear motor generally has a very high degree of positioning accuracy as compared with the conventional liner guide system, utilization of the coil 411 in a vacuum environment is not easy due to an outgassing problem of the coil 411. However, in the case of a conveying system applied to the organic layer deposition apparatus of the present disclosure, the conveying system may be driven while the gap between the magnetic rail 431*b* and the coil 411 is maintained to be about 5 mm. Accordingly, the coil 41 may be provided in the ATM box and installed in an atmospheric state, and the magnetic rail 431*b* may be fixed to the carrier 431 and the carrier 431 may move in the chamber 101 which is in a vacuum state.

The coil 411 may be accommodated in the ATM box (not illustrated). A hall may be provided at a location corresponding to the coil 411 inside the chamber 101 and be open to the outside. In addition, a bellows (not illustrated) surrounding the hall may be provided and the bellows and the ATM box are connected with each other. The bellows may denote a tube with a wrinkle shape and thus, a flexible movement may be possible via the wrinkle. As a result, the coil 411 may be accommodated in the ATM box and provided in an atmospheric state and the inside of the chamber 101 may continuously maintain the vacuum state. A cable (not illustrated) may be connected to the coil 411 in the atmospheric state and an external power may be applied to the coil 411. In this case, reinforcement plates (not illustrated) may be further included on a top and bottom portions of the bellows for a stable connection of the bellows with the chamber 101 and the ATM box. In addition, a sealing member (not illustrated), such as an O-ring, may be further included between the bellows and the ATM box, resulting in enhanced reliability of the vacuum state inside the chamber 101.

Since the ATM box is connected with the chamber 101 via the bellows, the ATM box and the coil 411 accommodated in the ATM box may maintain a fixed location despite of repeated shrinkage or expansion of the chamber 101. Thus, the gap between the coil 411 and the magnetic rail 431*b* may be constantly maintained. In addition, since the coil 411 is accommodated in the ATM box and provided in an atmospheric state, the linear motor may be used regardless of problems such as outgassing.

Next, the second conveying unit 420 and the moving unit 430 will be described in detail.

The second conveying unit 420 may move the electrostatic chuck 432 and the carrier 431 conveying the moving unit 430 back to the loading unit 200 after the substrate 21 has been separated from the moving unit 430 in the unloading unit 300. The second conveying unit 420 may include the coil 421, the roller guide 422, and the charging track 423.

The coil 421, the roller guide 422 and the charging track 423 may be provided on respective internal surfaces of the bottom housing 103, the coil 421 and the charging track 423 among them may be provided on the top side internal surfaces, and the roller guide 422 may be provided on the internal surfaces of both sides of the bottom housing 103. Although not illustrated in the drawing, the coil 421 may be provided in the ATM box, like the coil 411 of the first conveying unit 410.

The second conveying unit 420, like the first conveying unit 410, may also include the coil 421, and the magnetic rail 431*b* of the main body unit 431*a* of the carrier 431 and the coil 421 may be combined to form the driving unit. The driving unit may be a linear motor. Then, the carrier 431 may move in a direction opposite to the A direction in FIG. 2 via the linear motor.

The roller guide 422 may guide the carrier to move in one direction. The roller guide 422 may be configured to pass through the deposition unit 100. The roller guide 422 may support the cam follower 431*f* provided on both sides of the carrier 431 and guide the carrier 431 to move in a direction opposite to the A direction in FIG. 2. In other words, as the cam follower 431*f* on both sides of the carrier 431 rotates with the roller guide 422, the carrier may move. The cam follower 431*f* may be a kind of a bearing and used to repeat a particular movement. A plurality of cam followers 431*f* may be on side surfaces of the carrier 431 and work as wheels so that the carrier 431 may move in the second conveying unit 420. A detailed description on the cam follower 431*f* will be omitted.

Consequently, since the second conveying unit 420 is used not for depositing the organic material but for returning the empty carrier 431, a high positioning accuracy of the second conveying unit may not be needed compared with that of the first conveying unit 410. Accordingly, magnetic levitation may be used to obtain a high positioning accuracy for the first conveying unit 410, while a conventional roller method may be used for the second conveying unit 420, which may require a relatively low positioning accuracy. Thus, a manufacturing cost may be lowered and a configuration of the organic layer deposition apparatus 1 may be simplified. Although not illustrated in the drawing, the magnetic levitation may be applicable to the second conveying unit 420, as in the first conveying unit 410.

The organic layer deposition assembly 100-1 of the organic layer deposition apparatus 1 according to an exemplary embodiment may further include the camera 170 and the sensor 180 for an alignment.

The camera 170 may align in real-time a first mark (not illustrated) provided in a frame 155 of the patterning slit sheet 130, and a second mark (not illustrated) provided on the substrate 21. The camera 170 may be provided so as to secure a smooth visual field in the vacuum chamber 101 in which the deposition is in progress. To this end, the camera 170 may be in a camera accommodation unit 171 and be installed in an atmospheric state. In other words, similar to the coil 411 accommodated in the ATM box, the hall may be provided at a location corresponding to the camera 170 in the chamber 101, and be open to the outside, and the camera accommodation unit 171 may be extended from the hall. Thus, the camera 170 may be accommodated in the camera accommodation unit 171 and be provided in the atmospheric state, while the vacuum state may be continuously maintained inside the chamber 101. In such a configuration, the camera accommodation unit 171 and the camera 170 accommodated therein may maintain a fixed location, even though the chamber 101 may repeatedly experience shrinkage or expansion. Accordingly, a smooth visual field may be secured in the vacuum chamber 101 in which the deposition may be in progress.

Because the substrate 21 and the patterning slit sheet 130 are separated from each other, distances to the substrate 21 and the patterning slit sheet 130 at different locations from each other may need to be measured together via one camera 170. To this end, the organic layer deposition assembly 100-1 of the organic layer deposition apparatus 1 may include the sensor 180. The sensor 180 may include a confocal sensor. The confocal sensor may use a scanning mirror rotating at a high speed to scan an object via a laser beam and measure a distance to a measurement object via a fluorescence ray or a reflective ray emitted by the laser beam. The confocal sensor may measure the distance via sensing a boundary surface between two different media from each other.

In other words, the sensor 180 including the confocal sensor may be provided in the chamber 101 and on the substrate 21. The confocal sensor may obtain the distance to the top surface of the substrate 21 via sensing the boundary surface between the top surface of the substrate 21 and the space, and obtain the distance to the bottom surface of the substrate 21 via sensing the boundary surface between the bottom surface of the substrate 21 and the space. In addition, the sensor 180 may measure the distance to the top surface of the patterning slit sheet 130 via sensing the boundary surface between the top surface of the patterning slit sheet 130 and the space. As a result, the sensor 180 may obtain the distance between the substrate 21 and the patterning slit sheet 130 via measuring the distance to the bottom surface of the substrate 21 and the distance to the top surface of the patterning slit sheet 130.

Thus, a real-time measurement of the gap between the substrate 21 and the patterning slit sheet 130 may become possible via equipping the camera 170 and the sensor 180 and subsequently, a real-time alignment of the substrate 21 and the patterning slit sheet 130 may become possible. Accordingly, the location accuracy of the pattern may be further enhanced.

When an organic light emitting display apparatus (not illustrated) is manufactured via the organic layer deposition apparatus 1, the substrate 21 may be loaded through the loading unit 200 and then, be adhered to the moving unit 430. Next, the moving unit 430 may be conveyed into the chamber 101 via the first conveying unit 410 configured to pass through the chamber 101. In addition, as the substrate 21 is moved in a first direction (for example, +y-axis direction) via the first conveying unit 410, the deposition material may be deposited onto the substrate 21 via organic layer deposition assemblies 100-1 through 100-11 as described above.

When the process above is complete, the moving unit 430 may be separate from the substrate 21 in the unloading unit 300 and be returned via the second conveying unit 420.

While the moving unit 430 is being returned as described above, the CPS module 431c may generate an induction current via the charging track 423, and may charge the power supplier 431d connected thereto. In this case, heat may be generated and radiant heat may be eradiated to the outside in the charging track 423 due to a high voltage. However, because the inside of the chamber 101 approaches a vacuum in such a case, convection heat due to the charging track 423 may be almost zero.

The radiant heat generated in the charging track 423 as such may apply heat to the CPS module provided facing with the charging track 423 each other and the main body unit 431a having the CPS module provided thereon. A temperature in the main body unit 431a may increase by approximately about 5° C. through 7° C. due to such radiant heat.

When the radiant heat is applied to the main body unit 431a, the main body unit 431a may experience a thermal deformation. Because the main body unit 431a may be connected to or combined with other components each other and thermal expansion rates of components, which are formed of different materials and with different shapes, may be different from each other, the main body unit 431a may be deformed with a curvature or be twisted. In this case, the substrate 21 on the electrostatic chuck 432 may be twisted or deformed into a curved shape and a problem may occur that the deposition material supplied from the organic layer deposition assembly 100-1 may not be deposited onto the substrate 21 in a designed pattern.

However, in a case of the organic layer deposition apparatus 1 according to one or more exemplary embodiments, the shield unit 431g-1 may shield portions of the CPS module 431c and the main body unit 431a on an area in which the CPS module 431c is provided as described above, and the radiant heat described above may be blocked. In this case, at least a portion of the shield unit 431g-1 may block the portion of the main body unit 431a having the CPS module 431c provided thereon. For example, the shield unit 431g-1 may be provided on the main body unit 431a to shield a front surface of the main body unit 431a according to an exemplary embodiment. The shield unit 431g-1 may be provided on the main body unit 431a to shield the portion of the main body unit 431a having the CPS module 431c provided thereon according to another exemplary embodiment. The shield unit 431g-1 may be provided on the main body unit 431a to shield an entire surface of the main body unit 431a having the CPS module 431c provided thereon according to another exemplary embodiment. A detailed description will be given below with reference to a case in which the shield unit 431g-1 is provided on a portion of the main body unit 431a to shield only the portion having the CPS module 431c provided thereon of the main body unit 431a for the sake of convenience.

The shield unit 431g-1 described above may reflect radiant heat. Especially, the shield unit 431g-1, being provided on a surface facing with the charging track 423, may shield the portion of the main body unit 431a at which the radiant heat from the charging track 423 directly arrives.

Accordingly, the organic layer deposition apparatus 1 and the method of manufacturing the organic light emitting display may make it possible to deposit the deposition material onto the substrate 21 in a fine pattern via minimization of the thermal deformation of the carrier 431 during the movement of the moving unit 430.

In addition, the organic layer deposition apparatus 1 and the method of manufacturing the organic light emitting display apparatus may uniformly maintain the gap between the substrate 21 and the patterning slit sheet 130 on the front surface of the patterning slit sheet 130 via preventing the deformation of the carrier 431. Thus, when deposition materials realizing different colors from each other are deposited onto the substrate 21, an overlapping of patterns with different colors each other may be prevented.

The organic layer deposition apparatus 1 and the method of manufacturing the organic light emitting display apparatus may make it possible to produce products with high resolution via deposition of the deposition material with a high definition pattern.

Figure 5:
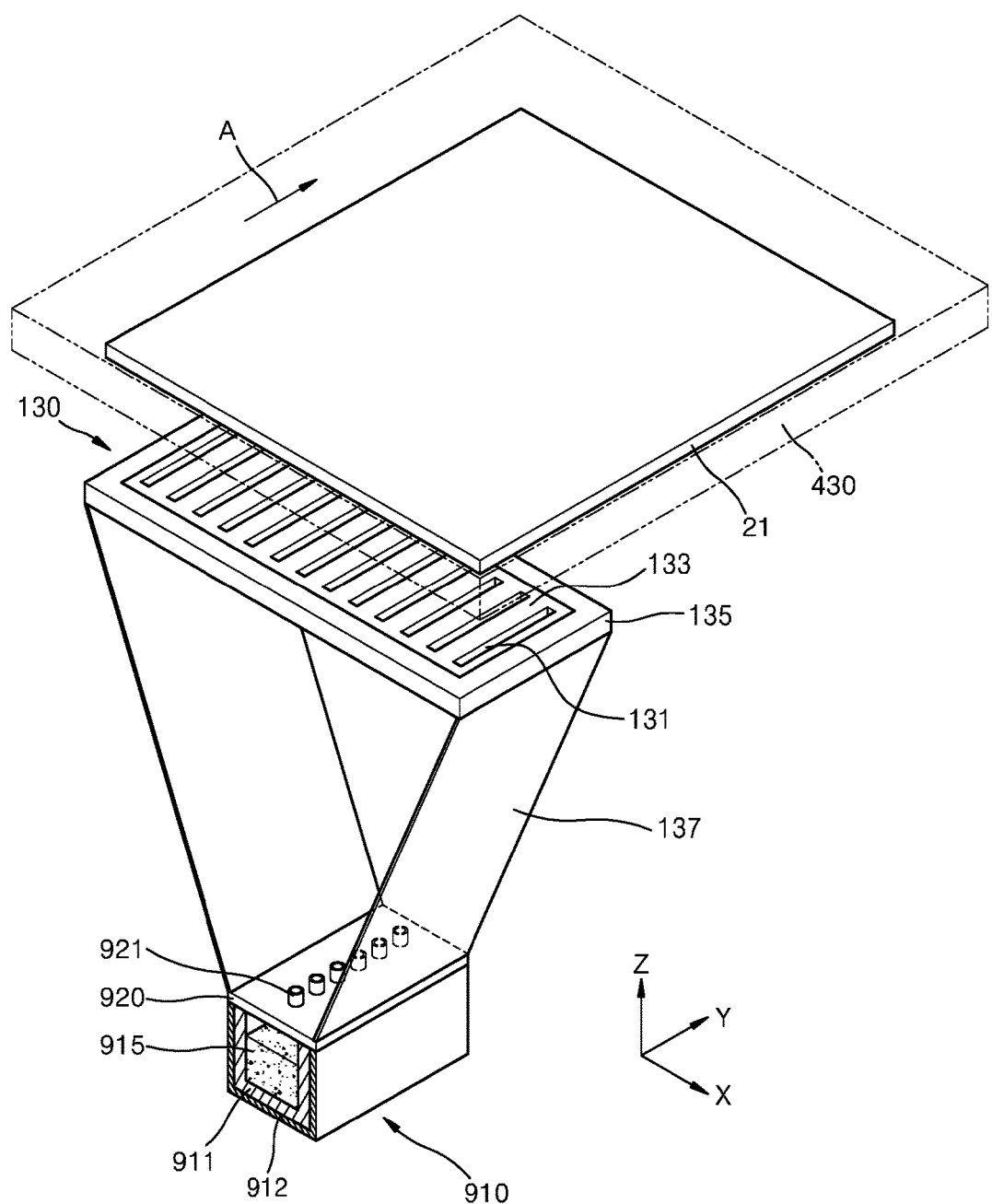
FIG. 5 is a perspective view of a portion of a deposition assembly of an organic layer deposition apparatus according to an exemplary embodiment.

FIG. 5 is a perspective view of a portion of a deposition assembly of an organic layer deposition apparatus according to one or more exemplary embodiments.

Referring to FIG. 5, in the organic layer deposition apparatus 1 according to the exemplary embodiments described above, deposition source nozzle units 120 of the deposition assembly 100-1 are described to include a plurality of deposition source nozzles 121 which intersect with the first direction (+y-axis direction) and are arranged in a second direction (for example, x-axis direction) in parallel with the substrate 21 adhered to the moving unit 430. However, in case of the organic layer deposition apparatus 1 according to an exemplary embodiment, a plurality of deposition source nozzles 921 of the deposition source nozzle unit 920 are arranged along the first direction (+y-axis direction).

When an intermediate layer including a light emitting layer is formed in a process of manufacturing the organic light emitting display apparatus, a common layer including an integral shape throughout an entire display area may be formed or a pattern layer provided on a certain area in display areas may be formed.

When the common layer is formed, as described above, the deposition source nozzle unit 120 of the organic layer deposition assembly 100-1 may include the plurality of deposition source nozzles 121 which intersect with the first direction (+y-axis direction) and are arranged in the second direction (for example, x-axis direction) in parallel with the substrate 21 adhered to the moving unit 430 so that a thickness uniformity of the common layer to be formed may be enhanced.

When the pattern layer is formed, as illustrated in FIG. 5, a deposition source nozzle unit 920 of the organic layer deposition assembly 100-1 may include a plurality of deposition source nozzles 921 arranged along the first direction (+y-axis direction) such that one deposition source nozzle 921, which intersects with the first direction (+y-axis direction) on a plane (a ZX plane) perpendicular to the first direction (+y-axis direction), may be provided along the second direction (for example, x-axis direction) in parallel with the substrate 21 adhered to the moving unit 430. Accordingly, when the pattern layer is formed, the occurrence of shadow may be largely reduced.

Only one deposition source 910 and one deposition source nozzle unit 920 are illustrated in FIG. 5; however, a first deposition source and a second deposition source may be sequentially arranged in the first direction (+y-axis direction), while a plurality of deposition source nozzles of the first deposition source nozzle unit on the first deposition source may be arranged along the first direction (+y-axis direction) and a plurality of deposition source nozzles of the second deposition source nozzle unit may be arranged along the first direction (+y-axis direction).

The patterning slit sheet 130 described above may have, in detail, a shape illustrated in FIG. 5. In other words, as illustrated in FIG. 5, the patterning slit sheet 130 may include the frame 135, roughly in a shape of the window frame, and a sheet combined therewith via methods such as welding. The sheet 133 may include a plurality of patterning slits 131 provided along, for example, the x-axis direction. A deposition material 915 in a furnace 911 of a deposition source 910 may evaporate via a heater 912, be irradiated through the deposition source nozzle 921 of the deposition source nozzle unit 920, pass through the patterning slit 131 of the patterning slit sheet 130, and arrive at the substrate 21. In this case, the deposition source 910 and/or the deposition source nozzle unit 920 and the patterning slit sheet 130 may be combined via a connecting member 137.

Figure 6:
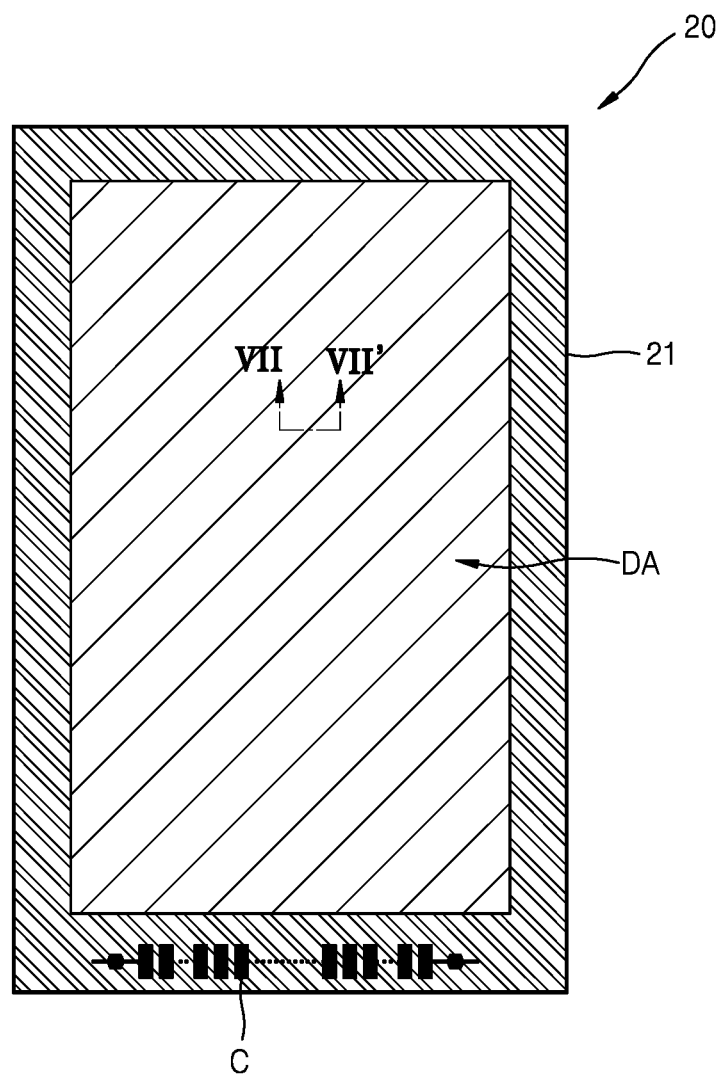
FIG. 6 is a plan view of an organic light emitting display apparatus manufactured via the organic layer deposition apparatus of FIG. 1 according to an exemplary embodiment.
Figure 7:
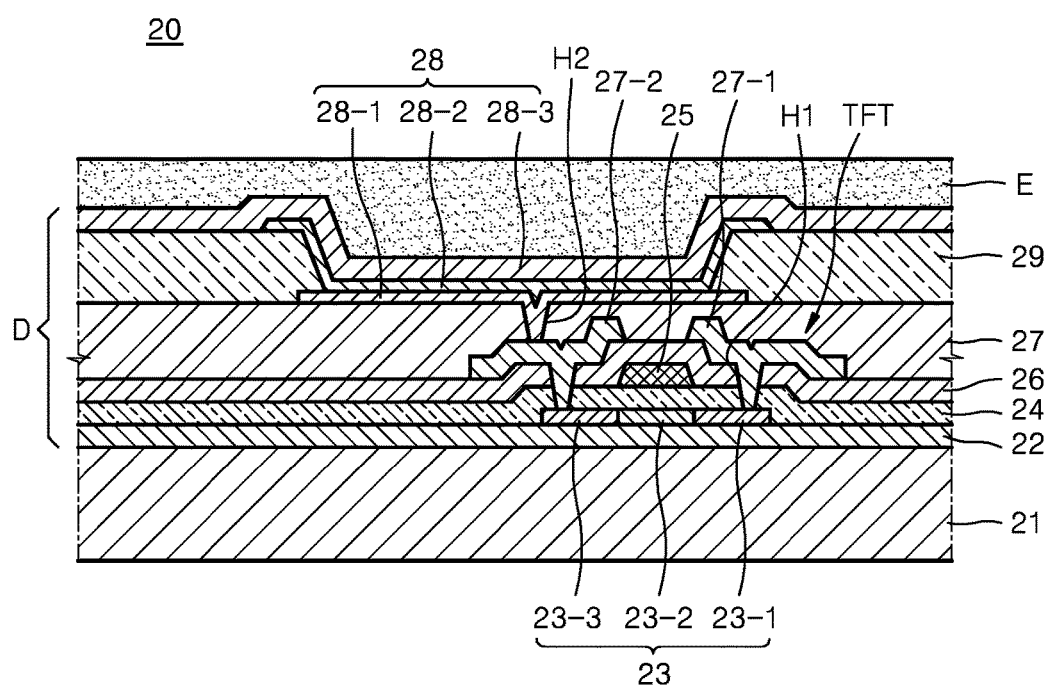
FIG. 7 is a cross-sectional view of FIG. 6, cut along a line VII-VII'.

FIG. 6 is a plan view of an organic light emitting display apparatus 20 manufactured via the organic layer deposition apparatus 1 of FIG. 1 according to an embodiment. FIG. 7 is a cross-sectional view of FIG. 6, cut along a line VII-VII'.

Referring to FIGS. 6 and 7, the organic light emitting display apparatus 20 may include a display area (DA) and a non-display area on the outskirt of the display area (DA) on the substrate 21. A light emitting unit (D) may be provided on the display area (DA) and a power wiring (not illustrated), etc., may be provided on the non-display area. In addition, a pad unit (C) may be provided on the non-display area.

The organic light emitting display apparatus 20 may include the substrate 21 and the light emitting unit (D). In addition, the organic light emitting display apparatus 20 may include a thin film encapsulating layer (E) provided on the top portion of the light emitting unit (D). The substrate 21 may include plastic materials and metals, such as "steel use stainless" (SUS) and titanium (Ti). In addition, the substrate 21 may include polyimide (PI). A detailed description will be given below with reference to a case in which the substrate 21 includes PI for the sake of convenience.

The light emitting unit (D) may be provided on the substrate 21. The light emitting unit (D) may include a thin film transistor (TFT) and a passivation layer 27 may be provided to cover the TFT. An organic light emitting diode 28 may be provided on the passivation layer 27.

The substrate 21 may include glass materials. However, the present invention is not limited thereto, and the substrate 21 may include plastic materials and metal materials such as SUS and Ti. In addition, the substrate 21 may include polyimide (PI). A detailed description will be given below with reference to a case in which the substrate 21 includes a glass material for the sake of convenience.

A buffer layer 22 including an organic compound and/or an inorganic compound may be further provided on the top surface of the substrate 21, and the buffer layer 21 may include $SiO_x(x \geq 1)$ or $SiN_x(x \geq 1)$.

An activation layer 23 arranged in a certain pattern may be provided on the buffer layer 22 and then, the activation layer 23 may be buried via a gate insulating layer 24. The activation layer 23 may include a source region 23-1 and a drain region 23-3, and further include a channel region 23-2 between the source and drain regions 23-1 and 23-3.

The activation layer 23 may include various materials. For example, the activation layer 23 may include inorganic semiconductor materials, such as amorphous silicon or crystalline silicon. As another example, the activation layer 23 may include oxide semiconductor materials. As another example, the activation layer 23 may include organic semiconductor materials. A detailed description will be given below with reference to a case in which the activation layer 23 includes amorphous silicon for the sake of convenience.

After an amorphous silicon film has been provided on the buffer layer 22, polycrystalline silicon may be formed via crystallization of the amorphous silicon film, and the activation layer 23 may be formed via patterning the polycrystalline silicon. Depending on a type of the TFT such as a driving TFT (not illustrated) and a switching, the source and drain regions 23-1 and 23-3 of the activation layer 23 may be doped with impurities.

A gate electrode 25 corresponding to the activation layer 23 and an intermediate insulating layer 26 embedding the gate electrode 25 may be provided on a top surface of a gate insulating layer 24.

After a contact hole H1 has been formed in the intermediate insulating layer 26 and the gate insulating layer 24, a source electrode 27-1 and a drain electrode 27-2 may be provided on the intermediate insulating layer 26 so as to be respectively in contact with the source region 23-1 and the drain region 23-3.

A passivation layer 27 may be provided on a top portion of the TFT formed as described above, and a pixel electrode 28-1 of an organic light emitting diode (OLED) 28 may be provided on the passivation layer 27. The pixel electrode 28-1 may be in contact with the drain electrode 27-2 of the TFT via a via hole H2 formed in the passivation layer 27. The passivation layer 27 may include a single layer or a multi-layer with more than two layers, of inorganic and/or organic materials. The passivation layer 27 may be formed as a planarization layer in which the top surface thereof is flattened regardless of indentation of layers thereunder or the top surface thereof is indented corresponding to indentation of layers thereunder. In addition, the passivation layer 27 may need to include a transparent insulating material to have a resonance effect.

After the pixel electrode 28-1 has been provided on the passivation layer 27, a pixel defining layer 29 including organic and/or inorganic materials may be provided to cover the pixel electrode 28-1 and the passivation layer 27, and openings in the pixel defining layer 29 may be formed to have the pixel electrode 28-1 exposed.

In addition, an intermediate layer 28-2 and a counter electrode 28-3 may be at least on the pixel electrode 28-1.

The pixel electrode 28-1 may function as an anode electrode and the counter electrode 28-3 as a cathode electrode; however, polarities of the pixel electrode 28-1 and the counter electrode 28-3 may be opposite to each other.

The pixel electrode 28-1 and the counter electrode 28-3 may be insulated via the intermediate layer 28-2, and the organic light emitting layer may emit light via applying voltages of different polarities from each other.

The intermediate layer 28-2 may include an organic emissive layer. As another selective example, the intermediate layer 28-2 may include the organic emission layer and additionally, at least one selected from a hole injection layer (HIL), a hole transport layer (HTL), an electron transport layer (ETL), and an electron injection layer (EIL). However, the present invention is not limited thereto, and the intermediate layer 28-2 may include the organic emission layer and may further include various function layers (not illustrated).

One unit pixel may include a plurality of sub-pixels and the plurality of sub-pixels may emit light with various colors. For example, the plurality of sub-pixels may include sub-pixels respectively emitting red color, green color and blue color, and sub-pixels (not illustrated) respectively emitting red color, green color, blue color and white color.

A thin film encapsulating layer E may include a plurality of inorganic material layers or include inorganic layers and organic layers.

The thin film encapsulating layer E may include a polymer, and may be, for example, a single layer or a laminated layer including any one of polyethylene terephthalate, polyimide, polycarbonate, epoxy, polyethylene, and polyacrylate (PAR). For example, the organic layer may include PAR. In detail, the organic layer may include a polymerized monomer composition including diacrylate monomer and triacrylate monomer. The monomer composition may further include monoacrylate monomer in another embodiment. In addition, the monomer composition may further include a photo-initiator such as thermoplastic olefin (TPO. However, the present invention is not limited thereto.

The inorganic layer of the thin film encapsulating layer E may be a single layer or a laminated layer including metal oxides or metal nitrides. In another exemplary embodiment, the inorganic layer may include any one of $SiN_x$, $Al_2O_3$, $SiO_2$, and $TiO_2$.

The uppermost layer, exposed to the outside, of the thin film encapsulating layer E may include the inorganic layer to prevent the infiltration of humidity into the organic light emitting diode.

The thin film encapsulating layer E may include at least one of a sandwich structure including at least one organic layer inserted between at least two inorganic layers. As another example, the thin film encapsulating layer E may include at least one of a sandwich structure including at least one inorganic layer inserted between at least two organic layers. As another example, the thin film encapsulating layer E may include at least one of a sandwich structure including at least one organic layer inserted between at least two inorganic layers and at least one of a sandwich structure including at least one inorganic layer inserted between at least two organic layers.

The thin film encapsulating layer E may include a first inorganic layer, a first organic layer, and a second inorganic layer in sequence from the top portion of the OLED.

As another example, the thin film encapsulating layer E may include the first inorganic layer, the first organic layer, the second inorganic layer, a second organic layer, and a third inorganic layer in sequence from the top portion of the OLED.

As another example, the thin film encapsulating layer E may include the first inorganic layer, the first organic layer, the second inorganic layer, the second organic layer, the third inorganic layer, a third organic layer, and a fourth inorganic layer in sequence from the top portion of the OLED.

A metal halide layer including lithium fluoride (LiF) may further be included between the OLED and the first inorganic layer. The metal halide layer may prevent damage on the OLED while the first inorganic layer is formed via a sputtering method.

An area of the first organic layer may be smaller than that of the second inorganic layer and the second organic layer may have a smaller area than the third inorganic layer.

Thus, the organic light emitting display apparatus 20 may realize high resolution.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic layer deposition apparatus comprising:
 a conveying unit comprising:
  a first conveying unit configured to convey, in a first direction, a moving unit to which a substrate is removably adhered; and
  a second conveying unit configured to convey, in a second direction opposite to the first direction, the moving unit from which the substrate has been separated, in which the moving unit is cyclically conveyed by the first and second conveying units; and a deposition unit comprising:
- a deposition assembly separate from the substrate and configured to deposit a material onto the substrate while the first conveying unit conveys the substrate adhered to the moving unit; and
- a housing having the deposition assembly provided therein and an internal space allowing the moving unit to pass therethrough, wherein the moving unit comprises:
a main body unit;
an electrostatic chuck provided on the main body unit and having the substrate adhered thereto;
a contactless power supply (CPS) module provided on the main body unit to face the electrostatic chuck; and
a shield unit in which at least a portion thereof is provided on the main body unit with the CPS module thereon to prevent heat transfer.

2. The organic layer deposition apparatus of claim 1, wherein a surface of the shield unit that faces a charging track of the second conveying unit is anodized.

3. The organic layer deposition apparatus of claim 2, wherein an outer surface of the shield unit is anodized in white color.

4. The organic layer deposition apparatus of claim 1, wherein the shield unit is integrally provided with the main body unit.

5. The organic layer deposition apparatus of claim 1, wherein the shield unit is separable from the main body unit.

6. The organic layer deposition apparatus of claim 1, wherein the deposition assembly comprises:
- a deposition source configured to supply a deposition material;
- a deposition source nozzle unit provided in a direction towards the first conveying unit of the deposition source and having a deposition source nozzle provided thereon; and
- a patterning slit sheet facing the deposition source nozzle unit and having a plurality of patterning slits provided in one direction, wherein the deposition material supplied from the deposition source passes through the patterning slit sheet and is deposited onto the substrate adhered to the moving unit.

7. A method of manufacturing an organic light emitting display apparatus, the method comprising:
adhering a substrate onto a bottom surface of a moving unit;
conveying the moving unit to a first conveying unit configured to pass through a chamber while the substrate is adhered to the moving unit;
forming a layer by depositing the deposition material supplied from the deposition assembly onto the substrate while conveying the substrate to the first conveying unit in the first direction with respect to the deposition assembly, in a state of maintaining the deposition assembly provided inside the chamber and the substrate separate from the deposition assembly; and
returning the moving unit having been separated from the substrate to a second conveying unit configured to pass through the chamber,
wherein the moving unit blocks a transfer of heat generated in the second conveying unit from being transferred to the moving unit while being returned by the second conveying unit.

8. The method of claim 7, wherein the moving unit comprises:
a main body unit;
an electrostatic chuck provided on the main body unit and having the substrate adhered thereto;
a contactless power supply (CPS) module provided opposite to the electrostatic chuck on the main body unit; and
a shield unit having at least a portion thereof provided on the main body unit including the CPS module and preventing heat transfer.

9. The method of claim 8, wherein a surface of the shield unit is anodized.

10. The method of claim 9, wherein an outer surface of the shield unit is anodized in white color.

11. The method of claim 8, wherein the shield unit is integrally provided with the main body unit.

12. The method of claim 8, wherein the shield unit is separable from the main body unit.

13. The method of claim 7, wherein the deposition material supplied from a deposition source passes through a patterning slit sheet and is deposited onto the substrate to form a pattern thereon.

14. The method of claim 7, wherein the moving unit is configured to make a cyclic rotation between the first and second conveying units, and the substrate adhered to the moving unit is configured to separated from the deposition assembly by a gap while being conveyed by the first conveying unit.

15. The method of claim 7, wherein a heat transfer is generated while a charging is performed from the second conveying unit, as the moving unit passes through the second conveying unit.

16. The method of claim 7, wherein the first and second conveying units are in parallel with each other.

17. The method of claim 7, wherein the moving unit rotates between the first and second conveying units.

* * * * *